(12) United States Patent
Byrne et al.

(10) Patent No.: US 11,594,850 B2
(45) Date of Patent: Feb. 28, 2023

(54) ELECTRICAL POWER UNIT

(71) Applicants: Norman R. Byrne, Ada, MI (US); Shane Rogers, Rockford, MI (US); Paul J. Martus, Grand Rapids, MI (US); Aaron G. Lautenbach, Rockford, MI (US)

(72) Inventors: Norman R. Byrne, Ada, MI (US); Shane Rogers, Rockford, MI (US); Paul J. Martus, Grand Rapids, MI (US); Aaron G. Lautenbach, Rockford, MI (US)

(73) Assignee: Norman R. Byrne, Ada, MI (US)

( * ) Notice: Subject to any disclaimer, the term of this patent is extended or adjusted under 35 U.S.C. 154(b) by 60 days.

(21) Appl. No.: 17/195,045

(22) Filed: Mar. 8, 2021

(65) Prior Publication Data
US 2021/0281029 A1  Sep. 9, 2021

Related U.S. Application Data

(60) Provisional application No. 62/986,247, filed on Mar. 6, 2020.

(51) Int. Cl.
| | |
|---|---|
| *H01R 24/76* | (2011.01) |
| *H01R 25/00* | (2006.01) |
| *H01R 13/66* | (2006.01) |
| *H01R 13/518* | (2006.01) |

(52) U.S. Cl.
CPC ......... *H01R 25/006* (2013.01); *H01R 13/518* (2013.01); *H01R 13/665* (2013.01); *H01R 24/76* (2013.01); *H01R 2201/06* (2013.01)

(58) Field of Classification Search
CPC .. H01R 25/006; H01R 13/518; H01R 13/665; H01R 24/76; H01R 2201/06; H01R 25/003; H01R 31/06
See application file for complete search history.

(56) References Cited

U.S. PATENT DOCUMENTS

| | | | |
|---|---|---|---|
| 5,396,062 A | * | 3/1995 | Eisentraut .......... H01R 13/7175 |
| | | | 250/239 |
| 7,182,633 B2 | | 2/2007 | Byrne |
| 7,559,795 B2 | | 7/2009 | Byrne |
| 8,444,432 B2 | | 5/2013 | Byrne |

(Continued)

FOREIGN PATENT DOCUMENTS

CN     109687215 A  *  4/2019

*Primary Examiner* — Tho D Ta
(74) *Attorney, Agent, or Firm* — Gardner, Linn, Burkhart & Ondersma LLP

(57) ABSTRACT

An electrical power unit or electronic data unit includes an outer housing, a circuit board positioned inside the outer housing, a frame inserted inside the outer housing, and a face plate fitted over the outer housing. The circuit board supports, for example, a high voltage AC electrical receptacle, a low voltage DC electrical receptacle, and a switch, each of which is electrically connected to the circuit board. The frame defines a plurality of outlet openings for receiving respective one of the AC electrical receptacle, the DC electrical receptacle, and the switch. The face plate defines outer receptacle openings that align with respective outlet openings of the frame to provide access to the respective AC electrical receptacle, DC electrical receptacle, and switch.

20 Claims, 8 Drawing Sheets

(56) References Cited

U.S. PATENT DOCUMENTS

| | | |
|---|---|---|
| 8,480,429 B2 | 7/2013 | Byrne |
| 8,954,170 B2 | 2/2015 | Chemel et al. |
| 9,312,673 B2 | 4/2016 | Byrne |
| 9,652,014 B2 | 5/2017 | Warwick et al. |
| 10,070,736 B2 | 9/2018 | Byrne et al. |
| 10,425,236 B2 | 9/2019 | Byrne et al. |
| 10,468,860 B2 | 11/2019 | Byrne et al. |
| 10,541,557 B2 | 1/2020 | Byrne et al. |
| 10,621,113 B2 | 4/2020 | Byrne et al. |
| 10,653,014 B2 | 5/2020 | Spiro |
| 10,770,843 B1 * | 9/2020 | Zhang ............... G06F 1/26 |
| 10,965,049 B2 | 3/2021 | Byrne et al. |
| 11,081,815 B2 | 8/2021 | Byrne et al. |
| 11,081,844 B2 | 8/2021 | Byrne et al. |
| 2004/0026998 A1 | 2/2004 | Henriott et al. |
| 2009/0103329 A1 * | 4/2009 | Wu ............... H01R 13/6675 |
| | | 362/642 |
| 2011/0104919 A1 * | 5/2011 | Patel ............... H01R 13/70 |
| | | 439/620.22 |
| 2012/0127637 A1 | 5/2012 | Byrne |
| 2014/0132084 A1 * | 5/2014 | Pham ............... H01R 24/78 |
| | | 307/140 |
| 2019/0035569 A1 | 1/2019 | Sadwick |
| 2019/0320515 A1 | 10/2019 | Sadwick |
| 2019/0372357 A1 | 12/2019 | Byrne et al. |
| 2020/0388971 A1 | 12/2020 | Byrne et al. |
| 2021/0036473 A1 * | 2/2021 | Moore ............... H02G 3/14 |

\* cited by examiner

ELECTRICAL POWER UNIT

CROSS REFERENCE TO RELATED APPLICATION

The present application claims the benefit of U.S. provisional application Ser. No. 62/986,247, filed Mar. 6, 2020, which is hereby incorporated herein by reference in its entirety.

FIELD OF THE INVENTION

The present invention relates to electrical power and/or data outlet or receptacle systems for use in work areas or the like.

BACKGROUND OF THE INVENTION

Electrical devices for home or business use typically derive power supplied from an electrical socket or outlet. Generally, the electrical outlet includes a pair of openings to receive a corresponding pair of prongs of an electrical plug, and often an additional opening to receive a grounding prong of the electrical plug. A typical electrical socket is primarily designed for use with electrical devices that use alternating current (AC) to operate. However, many portable personal electrical devices today utilize low voltage direct current (DC) power to charge and/or operate. These portable electrical devices often use a universal serial bus (USB) based connection to receive power for charging via a USB interface in the device, and may also transfer data through the USB interface. Thus, for these portable electrical devices to charge and operate in conjunction with a typical electrical outlet, some form of a power adapter is needed to provide DC power from the AC electrical outlet. A portable power adapter required to provide low voltage DC power from the AC electrical outlet, however, is somewhat bulky and inconvenient for a user of a portable electrical device to carry in case the portable electrical device requires additional charge.

SUMMARY OF THE INVENTION

The present invention provides an electrical power unit that allows powering of AC-powered devices and DC-powered electrical devices without the use of bulky portable power adapters and in a manner similar to a conventional electrical outlet. More specifically, the present invention is directed to a surface-mountable electrical power unit with exposed portions having a low thickness profile and configured to provide low voltage DC (such as USB) and AC power sourcing receptacles for charging respective DC-powered and AC-powered electrical devices without the use of portable power adapters.

In one form of the present invention, an electrical power unit or electronic data unit includes an outer housing, a circuit board positioned inside the outer housing, a frame inserted inside the outer housing, and a face plate fitted over the outer housing. The circuit board supports a high voltage AC electrical receptacle, a low voltage DC electrical receptacle, and optionally a switch, each of which is electrically connected to the circuit board. The frame defines a plurality of outlet openings for receiving respective one of the AC electrical receptacle, the DC electrical receptacle, and the switch. The face plate defines outer receptacle openings that align with respective outlet openings of the frame to provide access to the respective AC electrical receptacle, DC electrical receptacle, and switch.

Thus, the present invention provides an electrical power unit or electronic data unit that may be installed in a surface, such as a wall or a desk, and that allows DC-powered devices and AC-powered devices to easily connect to the same power source without use of bulky external power adapters. The electrical power unit of the present invention is easy to assemble, easy to use, and easy to install. Moreover, the unit of the present invention is compactly designed to have a very low thickness profile so that, when installed, it occupies minimal amount of space in the surface.

These and other objects, advantages, purposes and features of the present invention will become apparent upon review of the following specification in conjunction with the drawings.

DETAILED DESCRIPTION OF PREFERRED EMBODIMENTS

Figure 1A:
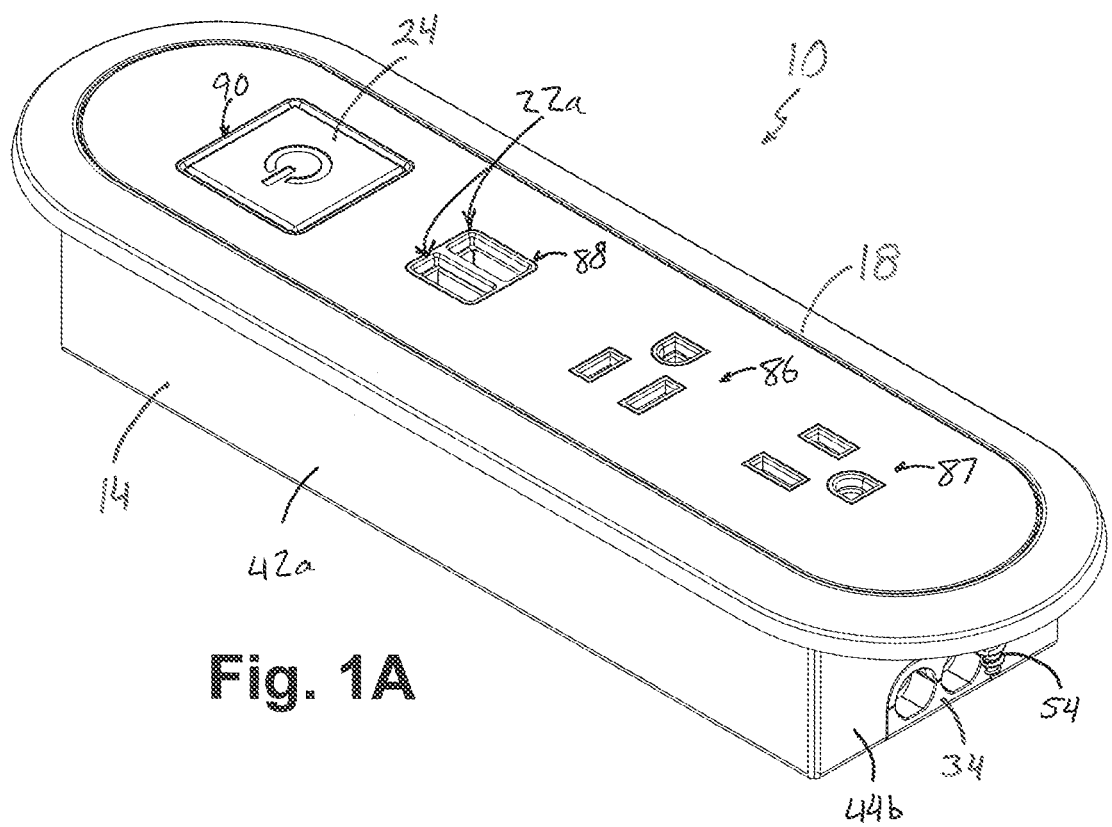
FIGS. 1A and 1B are top perspective views of an electrical power unit in accordance with the present invention.
Figure 1B:
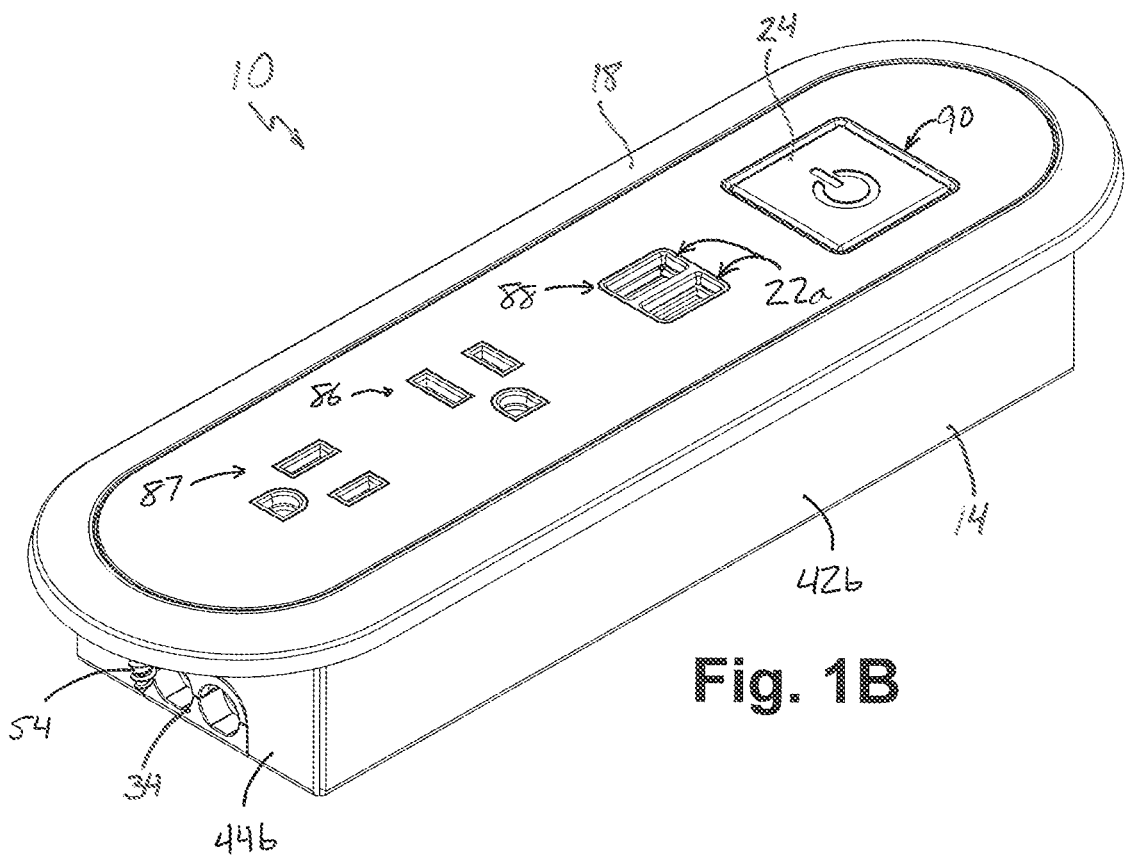
Figure 2A:
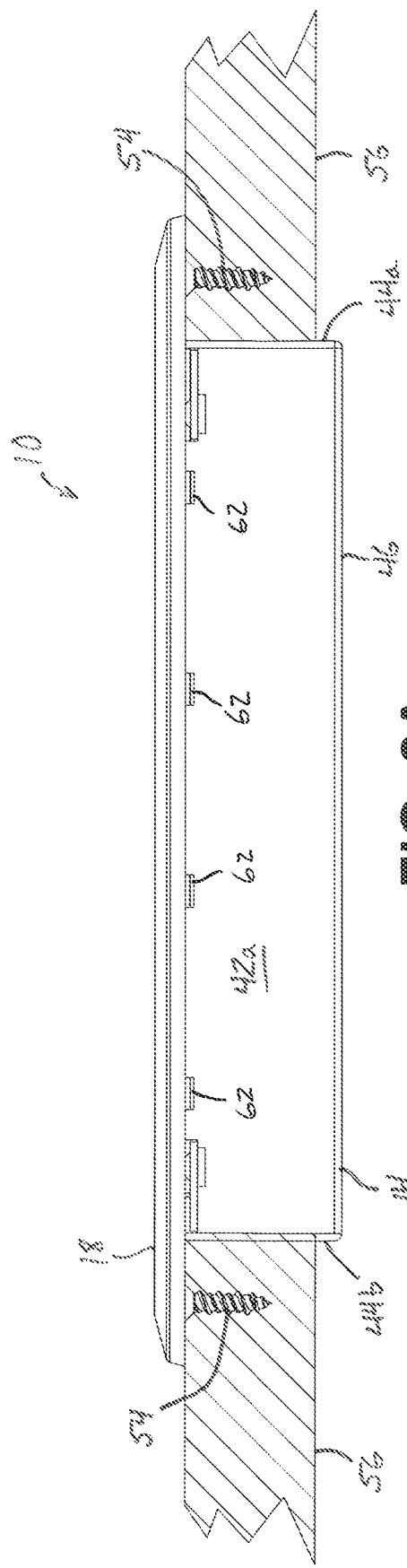
FIG. 2A is a side cross-sectional view of the electrical power unit illustrated in FIGS. 1A and 1B, shown mounted at an opening in a surface.
Figure 2B:
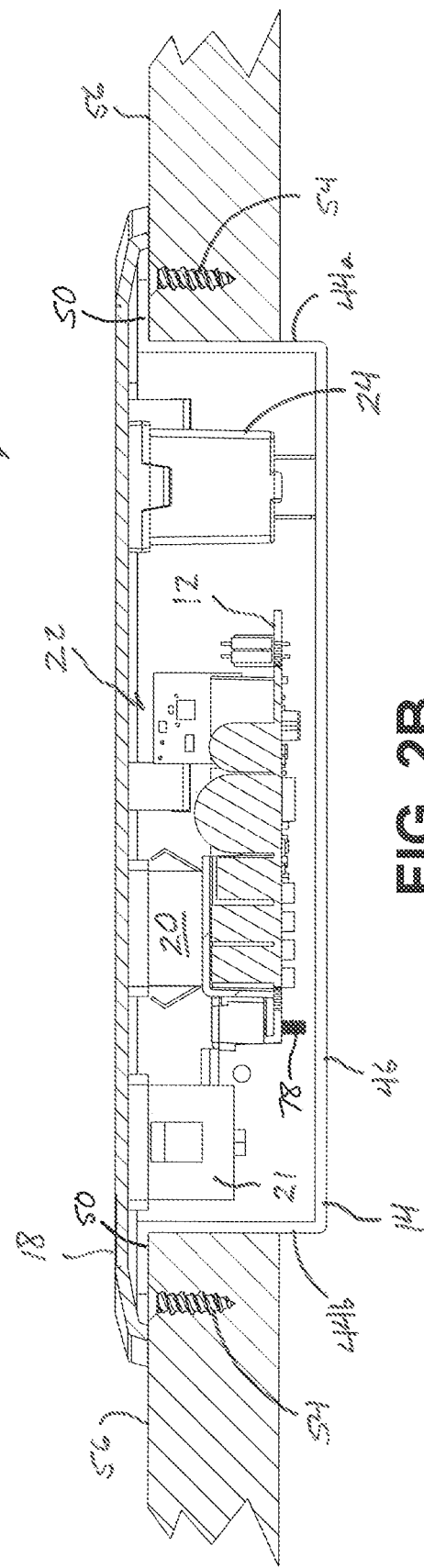
FIG. 2B is another side cross-sectional view of the electrical power unit illustrated in FIGS. 1A and 1B, shown with internal electrical components omitted.
Figure 3A:
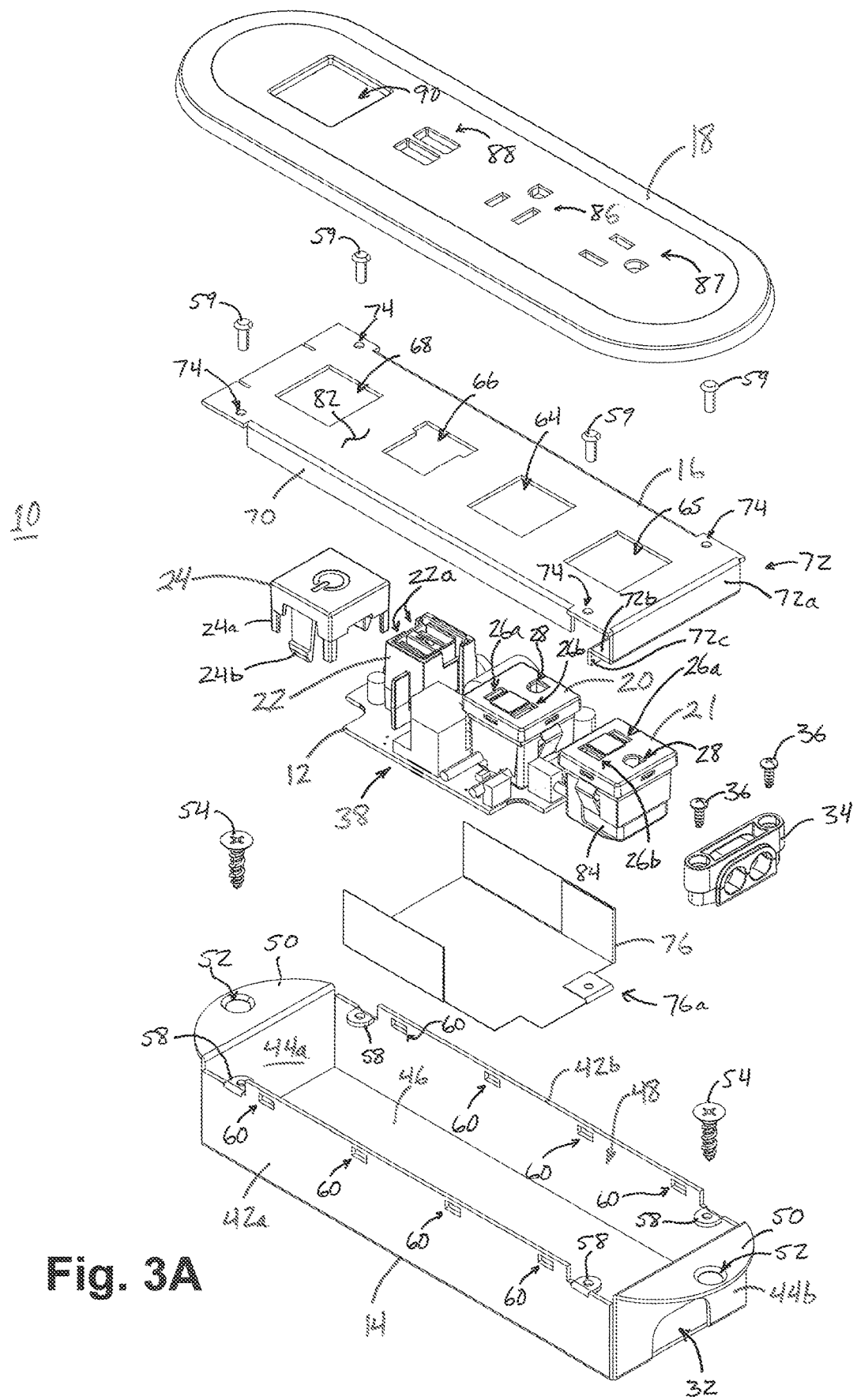
FIGS. 3A and 3B are exploded top perspective views of the electrical power unit illustrated in FIGS. 1A and 1B.
Figure 3B:
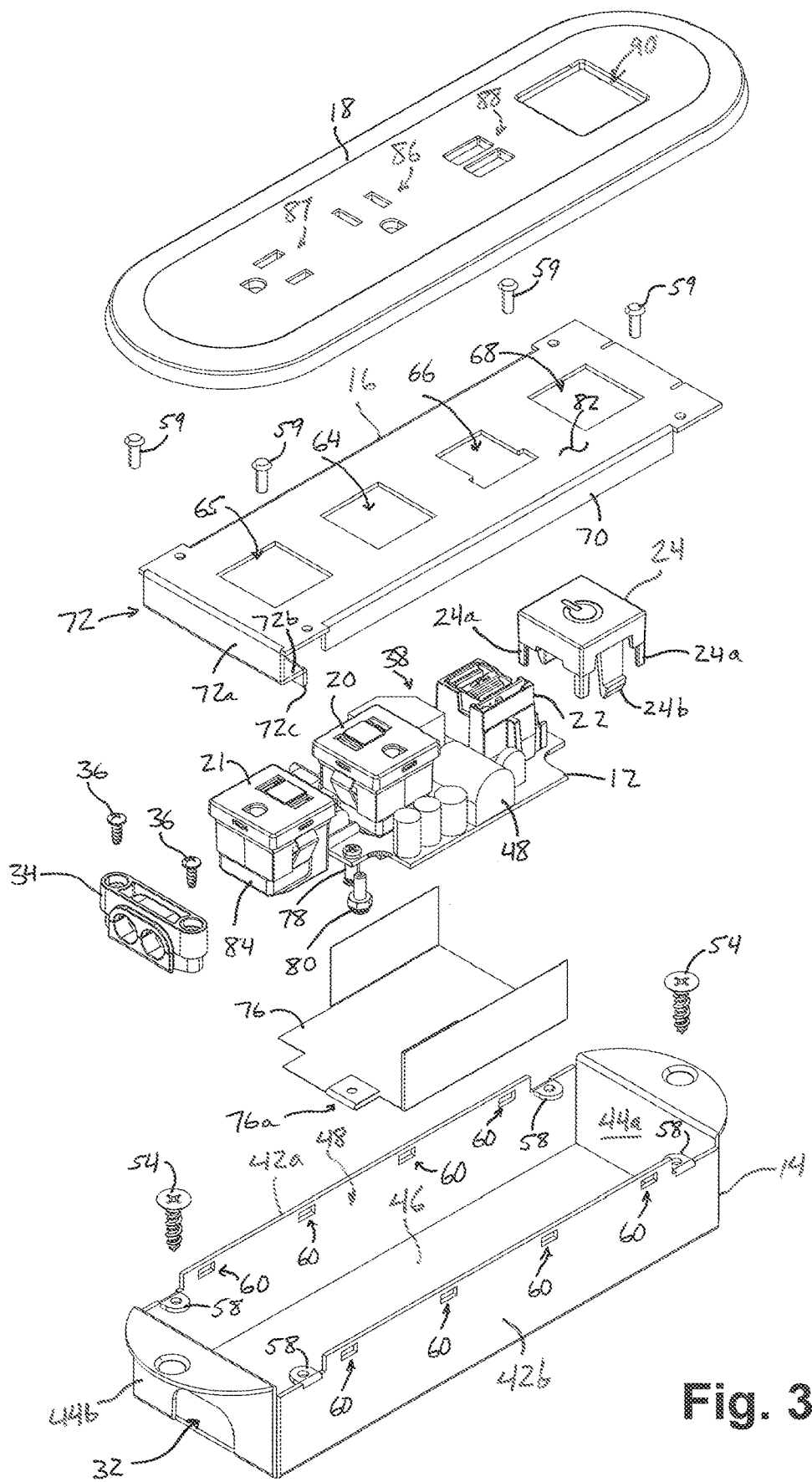
Figure 4A:
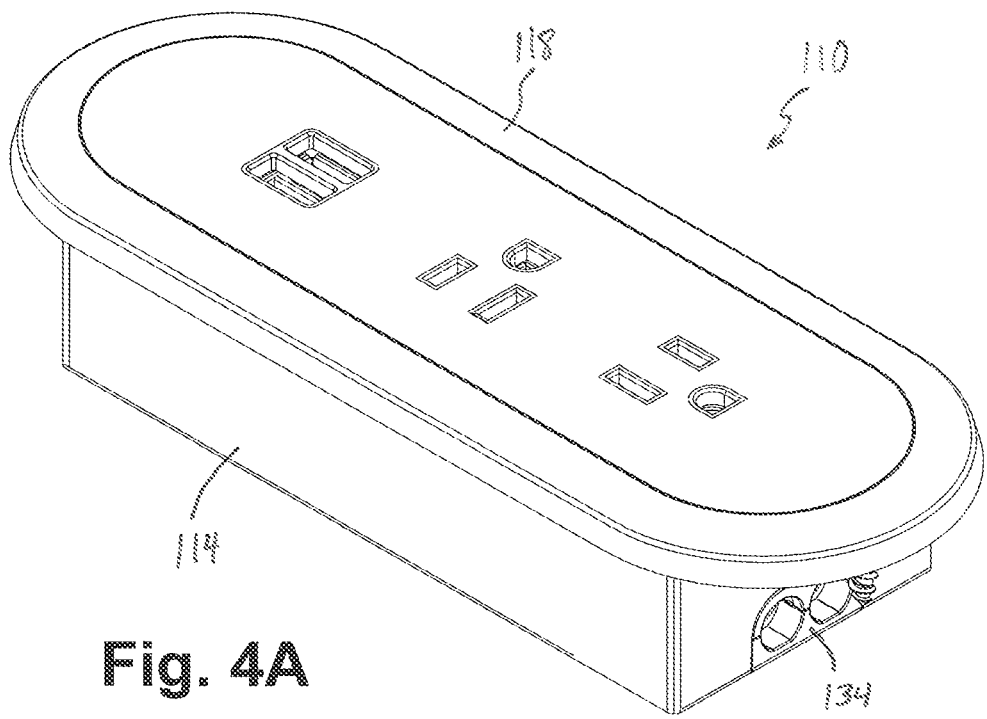
FIGS. 4A and 4B are top perspective views of another electrical power unit in accordance with the present invention.
Figure 4B:
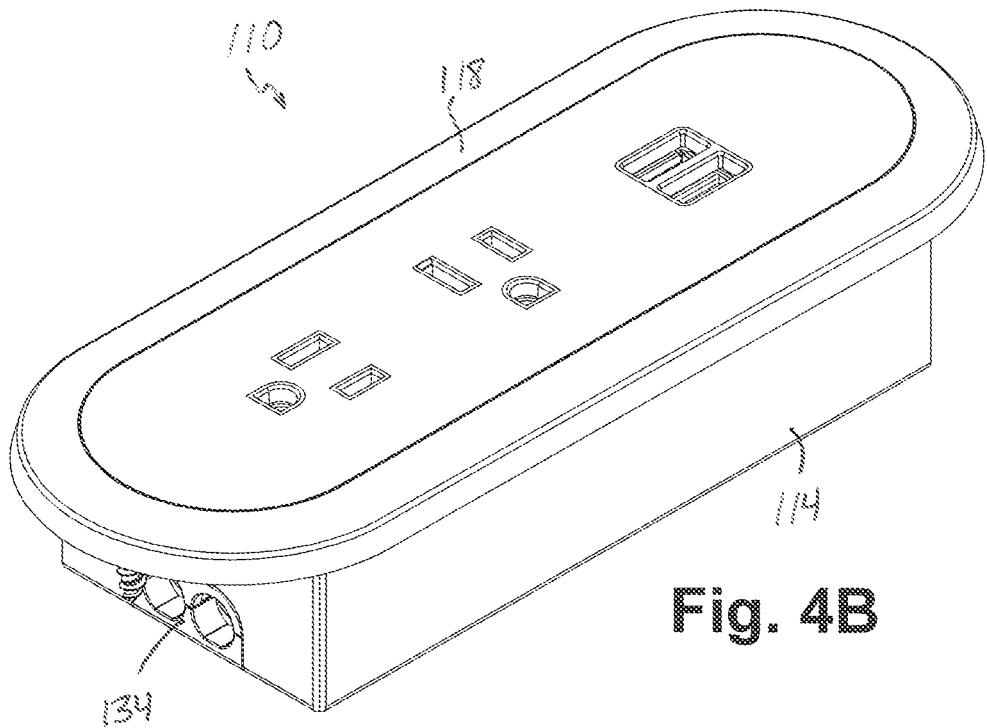
Figure 5A:
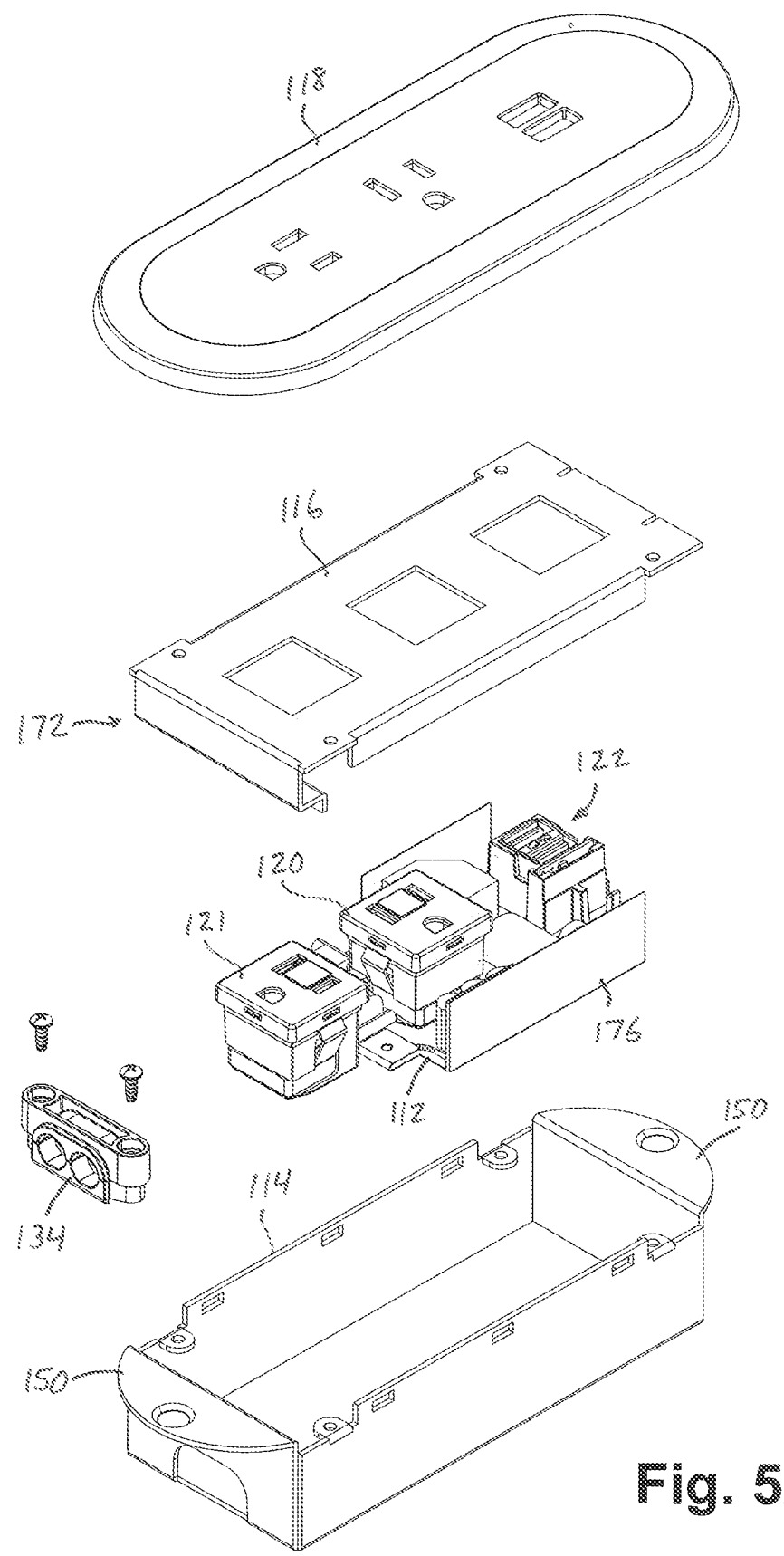
FIGS. 5A and 5B are exploded top perspective views of the electrical power unit illustrated in FIGS. 4A and 4B.
Figure 5B:
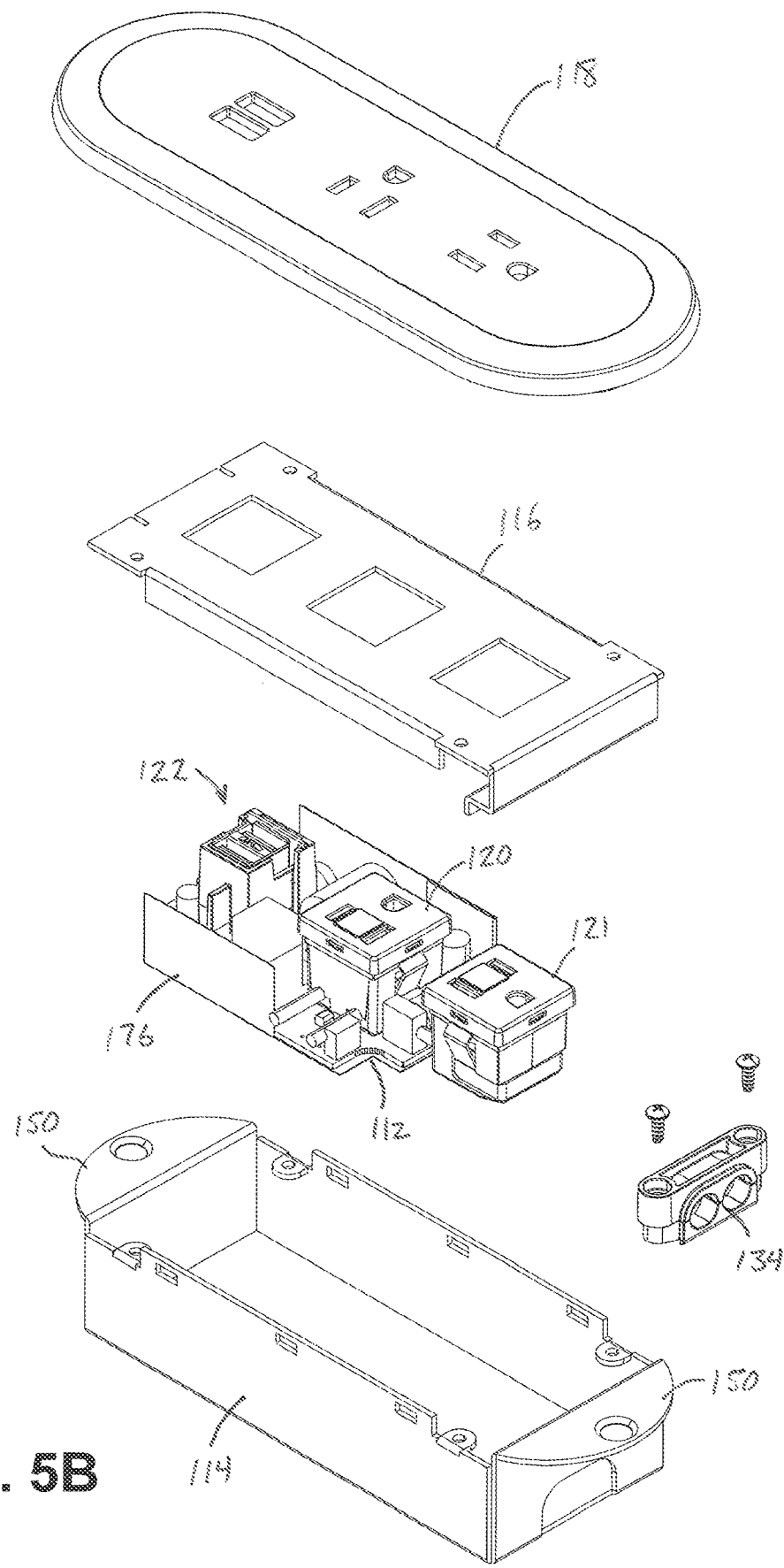

Referring now to the drawings and the illustrative embodiments depicted therein, a wall or surface mountable electrical power unit or electronic data unit 10 includes a circuit board 12 encased in an outer housing 14, a frame 16, and a face plate 18, such as shown in FIGS. 1A-3B. The circuit board 12 supports at least one alternating current (AC) electrical receptacle 20 and at least one low voltage direct current (DC) receptacle 22, and a switch 24, all in electrical communication with the circuit board 12. The circuit board 12 may be a printed circuit board (PCB) having a plurality of electrical conductors formed or established along the board 12 to route power to the plurality of high voltage AC electrical receptacle 20, DC receptacle 22, and the switch 24. In the illustrated embodiment, DC receptacle includes a pair of universal serial bus (USB) receptacles 22a, and an additional high voltage AC electrical receptacle 21 is spaced from the circuit board. The AC electrical receptacles 20, 21, the DC receptacle 22, and the switch 24 are arranged in-line as shown in FIGS. 3A and 3B. Other arrangements are also envisioned.

In FIGS. 3A and 3B, switch 24 is represented by a pushbutton cover with four corner guides 24a and a pair of latch tabs 24b that limit the outward or forward movement of the switch cover in response to an internal spring. A rear portion of switch 24 is supported by a pair of rearward-extending walls 24c as shown in FIG. 2B. Optionally, the front surface of switch 24 may be translucent and the switch internally illuminated so that the switch can be readily identified in dark environments. Switch 24 is an optional component of the electrical power unit 10, and various combinations of AC receptacles 20, 21 and/or DC receptacles 22 and/or electrical data connections (not shown) may be installed, without departing from the spirit and scope of the present invention.

In the illustrated embodiment, each AC electrical receptacle 20 includes female line receptacle opening 26a, a female neutral receptacle opening 26b, and a female ground opening 28 that accept respective prongs of inserted plugs and deliver current to AC-powered devices. Although the illustrative embodiment shown in FIGS. 1A-3B depicts two AC electrical receptacles 20, 21 electrically connected to the circuit board 12, it should be understood that any desired number of AC electrical receptacles 20, 21 may be provided.

Each DC receptacle 22 provides low voltage direct current (DC) to an electrical device connected, such as via a USB interface of the electrical device, to the electrical power unit 10. In the illustrated embodiment, the DC receptacle 22 provides a USB 2.0 Standard-A type connectors 22a, but it will be appreciated that the DC receptacle 22 may take other forms. For example, a USB 2.0 Standard-B type connector, Mini-A Mini-B, Micro-A, Micro-B, coaxial, or any other low voltage DC connector. It is further contemplated that the USB receptacles 22a do not include a host device and/or active data pins, so that any capable USB device can be charged and/or operated using a standard USB cable. It should also be understood that one or a plurality of DC receptacles 22 may be supported by the circuit board 12, and the USB receptacles 22a may provide power without providing data to connected USB devices, or both power and data. In the illustrated embodiment, two USB receptacles 22a are provided in an adjacent and parallel arrangement to one another, although other arrangements are also envisioned.

Power received from an input power cable 30 (FIG. 6) from a mains power source (not shown) is directed into the outer housing 14 via an opening 32 that is fitted with a dual-opening strain relief 34 as shown in FIGS. 1A, 1B, 3A, and 3B. If one of the openings in the strain relief 34 is not being utilized, it may be fitted with a plug to seal contaminants out of the housing 14. The strain relief 34 is a two-piece unit that is clamped around the power cable 30 by a pair of screws 36 (FIGS. 3A and 3B). Power cable 30 supplies high voltage AC electrical power to the AC electrical receptacles 20, 21, either directly or via the switch 24. Additionally, the AC power is directed to a regulated power supply (RPS) 38 and rectifier 40, forming a circuit for transforming AC power to low voltage regulated DC power. The converted current is then provided to the low voltage receptacle 22. Switch 24 may be operable to shut off electrical continuity from the input power cable 30 to the entire circuit board 12, or alternatively to AC electrical receptacles 20, 21, or DC receptacle 22 individually, or to another electrical power unit or electrical outlet assembly 110 (FIG. 6), as will be described below. Optionally, a plurality of switches 24 may be provided to selectively disconnect one or more AC electrical receptacles 20, 21 and/or DC receptacle 22 from the that, in the illustrated embodiment, includes a pair of universal serial bus (USB) receptacles 22a, and a switch 24. It is further envisioned that one or more switches 24 may additionally or alternatively regulate power supply to other electrical devices electrically connected to the main electrical power supply circuit (not shown), such as a lamp, air supply, or the like.

As best seen in FIGS. 3A and 3B, the outer housing 14 is configured as a generally rectangular and hollow box having longitudinally extending side walls 42a, 42b and laterally extending end walls 44a, 44b, with generally planar rear or bottom wall 46. Opposite the rear wall 46 is an opening 48 for receiving the circuit board 12, such that the circuit board 12 is fitted inside and is substantially encased in the outer housing 14, with forward or face portions of the AC electrical receptacles 20, 21, DC receptacle 22, and switch 24 being approximately aligned with forward edges of the walls 42a, 42b, 44a, 44b, such as shown in FIG. 2B. Referring to FIGS. 3A and 3B, end walls 44a, 44b each have an outwardly-extending flange 50 defining an opening 52 for receiving a respective threaded fastener 54 that can be secured into a substrate 56, such as shown in FIGS. 2A and 2B. In addition, each side wall 42a, 42b has a pair of inwardly-directed tabs 58 for receiving respective fasteners 59, such as threaded screws, rivets, or compressible tubular pins, which secure the frame 16 to the outer housing 14 at the tabs 58. A series of spaced-apart openings 62 formed along the upper or forward edge regions of each side wall 42a, 42b receive respective resilient tabs 62 (FIG. 2A) along an interior side region of the face plate 18, so that the face plate 18 can be removably secured to the housing 14 after the outer housing 14 has been secured to the substrate 56 with fasteners 54.

The frame 16 is provided to secure and/or limit movement of the receptacles 20, 21, 22 and circuit board 12 inside the outer housing 14. In the illustrated embodiment, and as best shown in FIGS. 3A and 3B, the frame 16 defines a plurality of apertures or outlet openings 64, 65, 66, and 68 of corresponding shapes and sizes to receive the respective AC electrical receptacles 20, 21, DC receptacle 22, and switch 24. The apertures 64, 65, 66, and 68 can be shaped and sized to allow corresponding receptacles and switches to be mounted in different arrangements and orientations, as desired. It should further be appreciated that if switch 24 is not included on the circuit board 12, switch aperture 68 may be omitted or used for another purpose, such as an additional outlet receptacle or wire pass-through, for example.

The frame 16 is formed as a generally rectangular plate with rearwardly- or downwardly-bent side portions 70 fitting down alongside inside surfaces of the outer housing's side walls 42a, 42b (FIGS. 3A and 3B). A rearwardly-extending Z-shaped end portion 72 includes an outboard vertical leg 72a, an inwardly-directed horizontal leg 72b, and an inboard vertical leg 72c. The outboard vertical leg 72a fits down alongside the outer housing's end wall 44b, while the horizontal leg 72b holds the strain relief 34 in position at opening 32 formed in end wall 44b, and the inboard vertical leg 72c helps to stabilize the AC electrical outlet 21. Fastener openings 74 receive the fasteners 59, which then pass into respective openings in the inwardly-directed tabs 58 of the outer housing 14. Frame 16 and outer housing 14 may be formed from stamped sheet metal, although it is envisioned that molded resinous plastic may also be used. Side portions 70 engage interior surfaces of side walls 42a, 42b and end portion 72 engages an interior surface of end wall 44b to stabilize the electrical receptacles relative to housing 14 and face plate 18. Optionally, the end of frame 16 opposite the rearwardly-extending end portion 72 engages or lies adjacent the housing's end wall 44a, proximate the outwardly-extending flange 50, to provide additional stabilization.

In the illustrated embodiment, a flexible pre-formed insulator sheet 76 forms an electrically insulative tray beneath and alongside the circuit board 12. Insulator sheet 76 includes a folded-over tab region 76a that receives a fastener 78, which is secured to the circuit board 12 as shown in FIG. 3B. Fastener 78 has a lower end portion that engages bottom wall 46 of outer housing 14, such as at a screw boss (not shown) to support the circuit board 12 at the bottom wall 46. A separate grounding screw 80 passes through the bottom wall 46 and electrically connects to a ground conductor of the input power cable 30 so that outer housing 14 is electrically grounded.

Prior to insertion of the circuit board 12, receptacles 20, 21, 22, and switch 24 into the outer housing's opening 48, the frame 16, circuit board 12, and receptacles 20, 21, 22 may be combined to form a pre-assembly that can be handled as a unit, optionally with power cord 30 and strain relief 34 fitted as well. To form the pre-assembly, rear portions of the switch 24, AC electrical receptacles 20, 21, and DC receptacle 22 are first inserted through the respective outlet openings 64, 65, 66, 68 of the frame 16, with the face portions of the respective AC electrical receptacles 20, 21, DC receptacle 22, as switch 24 positioned along a forward surface 82 of the frame 16. Once so-inserted, the switch 24, AC electrical receptacles 20, 21, and DC receptacle 22 are retained at the frame 16 such as by spring-clips 84, and are then wired to the circuit board 12, such as in one or more different manners disclosed in commonly-owned and co-pending U.S. patent application Ser. No. 16/403,922, Pub. No. 2019/0341712, filed May 6, 2019, and commonly-owned and co-pending U.S. provisional application Ser. No. 16/917,076, Pub. No. 2021-0005989, filed Jun. 30, 2020, both of which are hereby incorporated herein by reference in their entireties. This allows the frame 16 to be grasped and used as a fixture for the circuit board 12, receptacles 20, 21, 22, and switch 24 while establishing electrical connections to the circuit board 12. In this way, fixing the position of frame 16 relative to outer housing 14 also fixes the positions of the circuit board 12, receptacles 20, 22, and switch 24 relative to the outer housing 14.

As can be best seen in FIGS. 1 and 2, the face plate 18 snugly fits over the outer housing 14, and may attach to the outer housing 14 with resilient latch-tabs 62, adhesive, or the like. The face plate 18 defines a plurality of outer receptacle openings 86, 87, 88, 90 that align with respective AC receptacles 20, 21, DC receptacles 22a, and switch 24 to provide access to those components. Switch 24 is configured as a push-on push-off switch that toggles between open-connection and closed-connection states. It should also be appreciated that if switch 24 is not included on the circuit board 12, outer receptacle opening 90 may be omitted or used for another purpose, such as an additional outlet receptacle or wire pass-through, for example. It is further contemplated that an adhesive-backed decorative finish inlay or overlay (not shown) may be attached to an outer surface of the face plate 18 in order to provide a desired aesthetic appearance.

Figure 6:
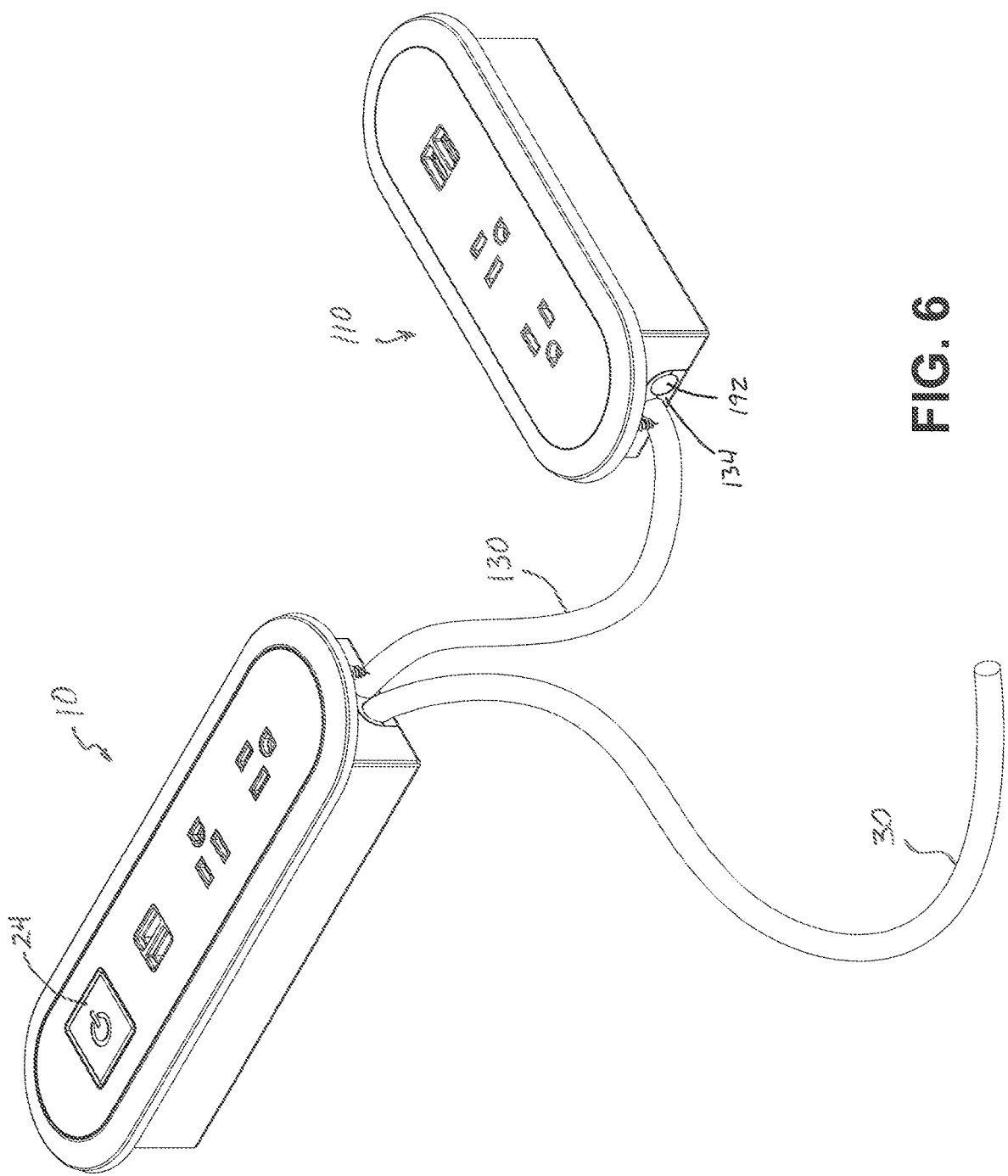
FIG. 6 is a perspective view of the electrical power unit of FIGS. 4A and 4B shown electrically coupled to the electrical power unit of FIGS. 1A and 1B, and with an electrical power cord for supplying power to both electrical power units.

Referring now to FIGS. 4A-5B, another electrical power unit or electrical outlet assembly 110 is substantially similar to the first power unit 10 described above, and has substantially the same construction but without a power switch. Like components and features of the switchless unit 110 are identified with like reference numbers by the addition of 100 so that the components and features may be understood with reference to the above discussion of the electrical power unit 10, and the remaining description focuses on the minor distinctions as well as the ability to link the switchless electrical power unit 110 to the switched unit 10 as shown in FIG. 6.

As described above, the switch 24 on electrical power unit 10 may be used to selectively energize and de-energize the switchless electrical power unit 110 so that electrical devices receiving power from the switchless electrical power unit 110 can be powered and de-powered by depressing the switch 24 on electrical power unit 10. A jumper cord 130 carries high voltage AC electrical power from switch 24 to the switchless electrical power unit 110 when the switch 24 is closed. The strain relief 134 of the switchless unit 110 receives the jumper cord 130 through one opening, while the adjacent opening is fitted with a plug 192 (FIG. 6). It will be appreciated that if a switchless unit 110 and jumper cord 130 are not provided with the electrical power unit 10, a plug may be fitted into one of the openings of the strain relief 34 on the power unit 10. Optionally, additional switched or switchless power units may be added downstream of the switchless unit 110 as desired. It is further envisioned that the switchless unit 110 and jumper cord 130 are representative of substantially any electrical power distribution device including a single-outlet or multi-outlet electrical extension cord. This allows for additional access to electrical power, such as in work spaces, with remote control of the downstream units via the switch on the first unit 10 to which power cord 30 is directly connected, similar to the manner described in commonly-owned U.S. patent application, Pub. No. 2020/0388971, filed Jun. 8, 2020, which is hereby incorporated herein by reference in its entirety.

Therefore, the electrical power unit of the present invention provides for convenient access to electrical power and/or electronic data. The power or data units are mountable in a surface, such as a wall, desk, or the like, and allow DC-powered devices and AC-powered devices to easily connect to the same power source without use of bulky external power adapters. Further, the electrical power unit of the present invention is configured as a compact, low thickness profile unit that is easy to assemble, easy to install, and easy to use. The system may also be particularly well suited for use in the hospitality industry, such as with one power unit mounted in a headboard of a bed, and another power unit mounted at a desk or nightstand and its power controlled via a switch on the headboard unit.

Changes and modifications in the specifically described embodiments may be carried out without departing from the principles of the present invention, which is intended to be limited only by the scope of the appended claims, as interpreted according to the principles of patent law including the doctrine of equivalents.

The embodiments of the invention in which an exclusive property or privilege is claimed are defined as follows:

1. An electrical power unit comprising:
   an outer housing;
   a circuit board positioned inside said outer housing;
   an electrical receptacle coupled to said circuit board;
   a frame defining an outlet opening and inserted into said outer housing, wherein said outlet opening is sized and shaped to receive said electrical receptacle;
   a face plate fitted over said outer housing, said face plate defining an outer receptacle opening aligned said outlet opening of said frame to provide access to said electrical receptacle;
   an electrical switch disposed in said outer housing and supported at said frame, wherein said electrical switch is accessible and actuatable at said face plate;

an electrical power input cord extending through said outer housing and electrically coupled to said switch;

an electrical jumper cord extending through said outer housing and electrically coupled to said switch; and an electrical outlet assembly coupled to said electrical jumper cord and positioned remotely from said outer housing;

wherein said electrical switch is operable to selectively energize and de-energize said electrical jumper cord and said electrical outlet assembly.

2. An electrical power unit comprising:

an outer housing;

a circuit board positioned inside said outer housing;

an electrical receptacle coupled to said circuit board;

a frame inserted into said outer housing, said frame comprising:

an outlet opening sized and shaped to receive said electrical receptacle;

a pair of rearwardly-extending side portions that are inserted alongside interior surfaces of respective side walls of said outer housing;

a rearwardly-extending end portion that is inserted alongside an interior surface of an end wall of said outer housing;

wherein said rearwardly-bent side portions and said rearwardly-extending end portion engage said interior surfaces of said outer housing to stabilize said electrical receptacle relative to said outer housing and said face plate;

a face plate fitted over said outer housing, said face plate defining an outer receptacle opening aligned said outlet opening of said frame to provide access to said electrical receptacle; and a strain relief configured to receive an electrical power cord and positioned at an opening formed in said end wall of said outer housing, wherein said rearwardly-extending end portion of said frame engages said strain relief to stabilize said strain relief relative to said outer housing.

3. The electrical power unit of claim 1, wherein said electrical receptacle comprises a low voltage direct current (DC) receptacle, and said electrical power unit comprising a voltage converter circuit coupled to said DC receptacle and configured to convert high voltage alternating current (AC) power to a low voltage direct current (DC) power.

4. The electrical power unit of claim 1, wherein said frame comprises a pair of rearwardly-extending side portions that are inserted alongside interior surfaces of respective side walls of said outer housing.

5. The electrical power unit of claim 4, wherein said frame comprises a rearwardly-extending end portion that is inserted alongside an interior surface of an end wall of said outer housing, wherein said rearwardly-bent side portions and said a rearwardly-extending end portion engage said interior surfaces of said outer housing to stabilize said electrical receptacle relative to said outer housing and said face plate.

6. The electrical power unit of claim 1, further comprising an AC electrical receptacle mechanically and electrically coupled to said circuit board, said AC electrical receptacle supported at said frame and accessible through said face plate.

7. The electrical power unit of claim 6, further comprising another AC electrical receptacle spaced from said circuit board and electrically coupled thereto, said another AC electrical receptacle supported at said frame and accessible through said face plate.

8. The electrical power unit of claim 7, wherein said electrical switch is in electrical communication with said circuit board and operable to energize and de-energize said electrical receptacle.

9. The electrical power unit of claim 2, further comprising an electrical switch disposed in said outer housing and supported at said frame, wherein said electrical switch is accessible and actuatable at said face plate, and said electrical switch is operable to energize and de-energize said electrical receptacle.

10. The electrical power unit of claim 2, further comprising:

an electrical switch disposed in said outer housing and supported at said frame, wherein said electrical switch is accessible and actuatable at said face plate;

an electrical power input cord extending through said outer housing and electrically coupled to said switch;

an electrical jumper cord extending through said outer housing and electrically coupled to said switch; and an electrical outlet assembly coupled to said electrical jumper cord and positioned remotely from said outer housing;

wherein said electrical switch is operable to selectively energize and de-energize said electrical jumper cord and said electrical outlet assembly.

11. An electrical power unit comprising:

an outer housing;

a circuit board positioned inside said outer housing;

an electrical receptacle coupled to said circuit board;

a frame defining an outlet opening and inserted into said outer housing, wherein said outlet opening is sized and shaped to receive said electrical receptacle;

a face plate fitted over said outer housing, said face plate defining an outer receptacle opening aligned said outlet opening of said frame to provide access to said electrical receptacle;

an electrical switch disposed in said outer housing and supported at said frame, wherein said electrical switch is accessible and actuatable at said face plate, and is in electrical communication with said circuit board;

an electrical power input cord extending through said outer housing and electrically coupled to said switch;

an electrical jumper cord extending through said outer housing and electrically coupled to said switch; and an electrical outlet assembly coupled to said electrical jumper cord and positioned remotely from said outer housing;

wherein said electrical switch is operable to selectively energize and de-energize said electrical jumper cord and said electrical outlet assembly.

12. The electrical power unit of claim 11, further comprising a strain relief configured to receive said electrical power input cord and said electrical jumper cord, said strain relief positioned at an opening formed in an end wall of said outer housing, wherein said frame comprises a rearwardly-extending end portion that is inserted alongside an interior surface of said end wall of said outer housing, wherein said rearwardly-extending end portion of said frame engages said strain relief to stabilize said strain relief relative to said outer housing.

13. The electrical power unit of claim 11, further comprising:

an AC electrical receptacle mechanically and electrically coupled to said circuit board, said AC electrical receptacle supported at said frame and accessible through said face plate; and another AC electrical receptacle spaced from said circuit board and electrically coupled thereto, said another AC electrical receptacle supported at said frame and accessible through said face plate.

14. An electrical power unit comprising:

an outer housing;

a circuit board positioned inside said outer housing, said circuit board supporting an alternating current (AC) electrical receptacle and a direct current (DC) electrical receptacle, each electrically connected to said circuit board;

a frame defining a plurality of outlet openings and inserted into said outer housing, wherein each of said plurality of outlet openings is configured to receive a respective one of said AC electrical receptacle and DC electrical receptacle;

a face plate fitted over said outer housing, said face plate defining outer receptacle openings that align with respective ones of said outlet openings of said frame to provide access to respective one of said AC electrical receptacle and DC electrical receptacle; and a switch electrically connected to said circuit board;

wherein said frame defines a switch outlet opening configured to receive said switch, and wherein said face plate defines a switch opening that aligns with said switch outlet opening of said frame to provide access to said switch.

15. The electrical power unit of claim 14, wherein said switch is operable to control electrical continuity from a main power source to at least one of said AC electrical receptacle and said DC receptacle.

16. The electrical power unit of claim 14, in combination with another electrical power unit electrically coupled to said electrical power unit via a jumper cord, wherein said jumper cord and said another electrical power unit are selectively energized in response to said switch.

17. The electrical power unit of claim 14, wherein said DC electrical receptacle provides low voltage direct current power to charge or operate a portable electronic device, and wherein said AC electrical receptacle provides high voltage alternating current power to charge or operate an AC-powered device.

18. The electrical power unit of claim 14, wherein said circuit board comprises a regulated power supply circuit for transforming high voltage alternating current power to low voltage direct current power.

19. The electrical power unit of claim 14, wherein said frame is secured to said outer housing via a plurality of fasteners.

20. The electrical power unit of claim 19, wherein said face plate is attached to said outer housing with resilient latch tabs engaging respective openings formed in said outer housing.

* * * * *